United States Patent [19]

Kramer

[11] 4,038,253

[45] July 26, 1977

[54] PHOTOCROSS-LINKABLE POLYMERS CONTAINING PENDANT DIAZOESTER GROUPS

[75] Inventor: Brian D. Kramer, Wilmington, Del.

[73] Assignee: Hercules Incorporated, Wilmington, Del.

[21] Appl. No.: 692,166

[22] Filed: June 2, 1976

Related U.S. Application Data

[63] Continuation of Ser. No. 412,218, Nov. 2, 1973, abandoned.

[51] Int. Cl.² .................. C08F 116/02; C08F 218/00; C08B 31/00; C07C 113/00
[52] U.S. Cl. ..................................... 260/47 R; 96/33; 96/36.2; 101/453; 204/159.18; 260/47 EP; 260/141; 260/239 AA; 260/313.1; 526/7; 526/9; 536/31.58; 536/68; 536/69; 536/83

[58] Field of Search .................. 260/2, 313, 239 AA, 260/141, 214, 227, 144, 47, 61, 75, 79; 526/7, 9; 204/159.18

[56] References Cited

U.S. PATENT DOCUMENTS 3,717,592   2/1973   Rave ............................... 204/159.18

*Primary Examiner*—Joseph L. Schofer
*Assistant Examiner*—Herbert J. Lilling
*Attorney, Agent, or Firm*—Marion C. Staves

[57] ABSTRACT

It has been found that certain polymers containing pendant diazo ester groups are photosensitive and have utility in the preparation of both lithographic and relief printing plates, as well as for etching resists for printed circuits.

5 Claims, No Drawings

PHOTOCROSS-LINKABLE POLYMERS CONTAINING PENDANT DIAZOESTER GROUPS

This is a continuation of application Ser. No. 412,218, filed Nov. 2, 1973 now abandoned.

This invention relates to novel polymers and their use in preparing printing plates. More particularly, this invention relates to photocross-linkable polymers having pendant diazo ester groups and printing plates prepared therefrom.

Photocross-linkable polymers are known in the art. U.S. Pat. No. 3,467,523, for example, shows polymers containing azidosulfonyl groups attached to a polymer chain, which can be used as light-sensitive substances in printing plates, etc. Unfortunately, the polymers containing azidosulfonyl groups are limited in that they require the use of a sensitizing agent to render them crosslinkable at a practical rate with visible or normal ultraviolet light (without a sensitizer, they require the use of short wavelength ultraviolet light).

It has now been found that certain polymers containing pendant diazo ester groups are capable of being photocross-linked without the use of sensitizing agents and are excellently suited for use in the preparation of both lithographic and relief printing plates, as well as for etching resists for printed circuits. In contrast to many photocross-linkable polymer systems, they are not insensitized by the presence of air. Specifically, the polymers containing pendant diazo ester groups in accordance with this invention are the photosensitive polymers which have the following units

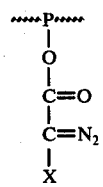

where P is the polymeric backbone and X is a group selected from —H,

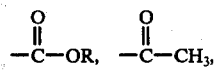

—CN and —Ar, where Ar is selected from phenyl and phenyl substituted with 1 to 3 —$NO_2$, Cl, F, Br, $C_{1-8}$ alkyl or $C_{1-5}$ alkyloxy groups and R is selected from $C_{1-18}$ alkyl, $C_{5-7}$ cycloalkyl, $C_{1-4}$ alkyl substituted $C_{5-7}$ cycloalkyl, and Ar where Ar is as defined above.

Any soluble hydroxy containing polymer which can be esterified to give the desirable pendant groups can be used as the backbone polymer, providing it contains no functional groups which react with or decompose diazo groups thermally (e.g., fumarate esters or sulfonic acids). Typical hydroxyl containing polymers that can be used in this invention are the partly or completely hydrolyzed vinyl acetate polymers, such as poly (vinyl acetate), ethylene—vinyl acetate copolymer and vinyl chloride—vinyl acetate copolymer; vinyl alcohol polymers, such as poly (vinyl alcohol); allyl alcohol copolymers such as styrene—allyl alcohol copolymer; cellulose and cellulose ethers and esters, such as cellulose, hydroxyethyl cellulose, ethyl cellulose, hydroxypropyl cellulose, ethyl hydroxyethyl cellulose and hydroxypropyl methyl cellulose; thermoplastic phenoxy resins, such as the condensation product of bisphenol A and epichlorohydrin without epoxy end groups; and polymers and copolymers of hydroxyalkyl acrylates and methacrylates, such as styrene—hydroxy ethyl acrylate and poly (hydroxyethyl methacrylate). Polymers which are water soluble, or soluble in aqueous solutions, such as water-alcohol mixtures or salt solutions are particularly desirable.

The polymers containing pendant diazo ester groups of this invention can be prepared by several methods which will be obvious to those skilled in the art. One method, for example, particularly applicable when X is

or nitrophenyl is to partially esterify the hydroxyl containing polymer as follows

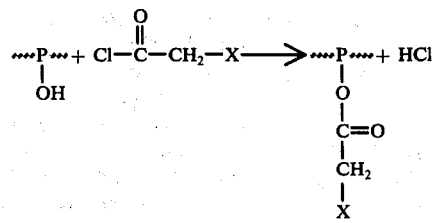

and then to diazotize the resulting ester as follows

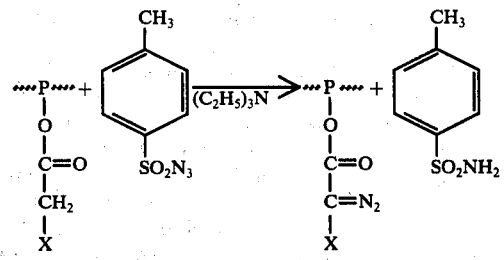

Typical of the acid chlorides that may be used to esterify the hydroxyl containing polymer are ethyl malonyl chloride, phenyl malonyl chloride, methyl malonyl chloride, 4-nitrophenylacetyl chloride and 2,4-dinitrophenylacetyl chloride.

Another method of synthesis utilizes the reaction of the p-toluenesulfonylhydrazone of a carboxylic acid chloride containing an α carbonyl group with a hydroxyl containing polymer in the presence of a strong base.

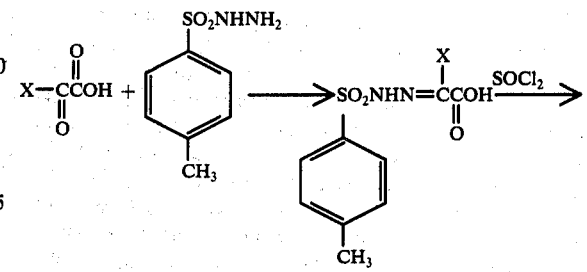

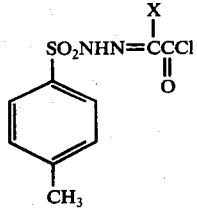

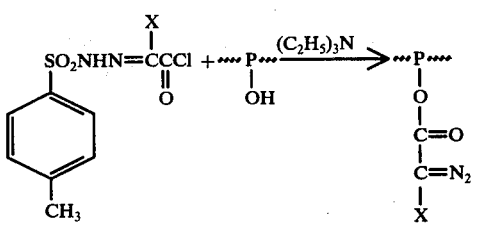

Typical of carboxylic acids containing an α-carbonyl group which may be used are glyoxylic acid, benzoylformic acid, 4-methoxy-benzoylformic acid, 4-methylbenzoylformic acid, and 4-chlorobenzoylformic acid.

It will be understood that the above preparatory methods are only illustrative and that other approaches and variations will be obvious to those skilled in the art. It is desirable in most cases to only partially esterify the hydroxyl groups of the hydroxyl-containing polymers and thus obtain a polymer with fewer diazo ester groups. In general, only enough diazo ester groups to effect cross-linking of the polymer are required. Most desirably, there will be approximately one diazo ester group per 1 to 100 hydroxyl-containing monomer units in the polymer chain in the case of vinyl and condensation polymers and approximately one diazo ester group per 0.4 to 25 anhydroglucose units in the case of cellulose and cellulose derivatives.

Typical of the photocross-linkable polymers containing pendant diazo ester groups of this invention are the diazoacetyl ester of the condensation product of bisphenol A and epichlorohydrin containing no epoxy end groups, the ethyldiazomalonyl ester of hydrolyzed ethylene—vinyl acetate copolymer, the phenyldiazomalonyl ester of hydrolyzed ethylene—vinyl acetate copolymer, the diazoacetyl ester of hydrolyzed ethylene—vinyl acetate copolymer, the p-nitrophenyldiazoacetyl ester of hydrolyzed ethylene—vinyl acetate copolymer, the phenyldiazoacetyl ester of hydrolyzed ethylene—vinyl acetate copolymer, the diazoacetyl ester of styrene—allyl alcohol copolymer, the ethyl diazomalonyl ester of poly (vinyl alcohol), the 2,4-dinitrophenyldiazoacetyl ester of hydroxypropyl cellulose, the methyl diazomalonyl ester of ethyl cellulose, the diazoacetyl ester of methyl acrylate—hydroxyethyl acrylate copolymer, the p-chlorophenyldiazoacetyl ester of hydroxypropyl cellulose, the p-methoxyphenyldiazoacetyl ester of ethyl cellulose, the cyanodiazoacetyl ester of hydrolyzed ethylene—vinyl acetate copolymer, the acetodiazoacetyl ester of hydrolyzed ethylene—vinyl acetate copolymer, the acetodiazoacetyl ester of poly (vinyl alcohol), the o-,m-, and p-tolyldiazoacetyl esters of hydroxypropyl cellulose, the ethyldiazomalonyl ester of styrene—hydroxypropyl acrylate copolymer, the acetodiazoacetyl ester of poly (vinyl alcohol), the methyldiazomalonyl ester of the condensation product of bis-phenol A and epichlorohydrin containing no epoxy end groups, the acetodiazoacetyl ester of hydroxyethyl cellulose, the p-nitrophenyldiazoacetyl ester of poly (vinyl alcohol), the ethyl diazomalonyl ester of hydroxypropyl cellulose, the ethyldiazomalonyl ester of methyl hydroxypropyl cellulose, the methyldiazomalonyl ester of the condensation product of bisphenol A and epichlorohydrin containing no epoxy end groups, the acetodiazoacetyl ester of methyl methacrylate—hydroxyethyl methacrylate copolymer, the chlorophenyldiazoacetyl ester of poly (vinyl alcohol), the m-fluorophenyldiazoacetyl ester of hydrolyzed ethylene—vinyl acetate copolymer, the octyldizomalonyl ester of poly (vinyl alcohol), the stearyldiazomalonyl ester of poly (vinyl alcohol), the p-bromophenyldiazoacetyl ester of hydrolyzed ethylene—vinyl acetate copolymer, the 4-tert.-butylcyclohexyldiazomalonyl ester of poly (vinyl alcohol), the 4-methylcycloheptyldiazomalonyl ester or poly (vinyl alcoho), the cyclopentyldiazomalonyl ester of hydroxyethyl cellulose, the cyclohexyldiazomalonyl ester of hydroxyethyl cellulose, the cycloheptyldiazomalonyl ester of hydroxyethyl cellulose, the p-nitrophenyldiazomalonyl ester of hydroxyethyl cellulose, the 2,4-dinitrophenyldizomalonyl ester of hydroxyethyl cellulose, the 2,4,6-trinitrophenyldiazomalonyl ester of hydroxyethyl cellulose, the 2,4,6-trichlorophenyldiazomalonyl ester of hydroxyethyl cellulose, the p-tolyldiazomalonyl ester of partially hydrolyzed poly (vinyl acetate), the m-ethylphenyldiazomalonyl ester of partially hydrolyzed poly (vinyl acetate), the p-hexylphenyldiazomalonyl ester of partially hydrolyzed poly (vinyl acetate), the p-octylphenyldiazomalonyl ester of partially hydrolyzed poly (vinyl acetate), the p-methoxyphenyldiazomalonyl ester of partially hydrolyzed poly (vinyl acetate), the m-butyloxyphenyldiazomalonyl ester of partially hydrolyzed poly (vinyl acetate), the p-amyloxyphenyldiazomalonyl ester of partially hydrolyzed poly (vinyl acetate), the p-amloxyphenyldiazoacetyl ester of hydrolyzed ethylene—vinyl acetate copolymer, the p-octylphenyldiazoacetyl ester of hydrolyzed ethylene—vinyl acetate copolymer, etc.

The polymers containing pendant diazo ester groups may be utilized alone or in admixture with other materials. It may be desirable in certain cases to extend the diazo ester containing polymer with inorganic or organic fillers, including other polymers, with solubility characteristics similar to those of the photocross-linkable polymer employed. It may also be desirable to add other compounding ingredients such as plasticizers, antioxidants, etc., just as long as they do not interfere with the absorption of light by the polymer and do not cause decomposition of the diazo groups. Obviously, there are many cases in which plasticizers and fillers are not required or desired, and excellent printing plates can be prepared with the diazo ester containing polymer alone.

In practice, the photocross-linkable polymer will generally be coated on a suitable support. Typical supports that can be used are grained or ungrained plastic sheets such as polyamides, polyesters, polycarbonates and polyolefins; paper and paper foils; and grained or ungrained metal sheets such as aluminum, zinc, copper, iron, steel, silver and gold. Obviously, the more expensive metals will not normally be used as supports in printing plates but can be used as a laminate over plastic in preparing etching resists for printed circuits. By the term "grained", used above, is meant a lithographic graining generally described as a microscopic surface roughness essentially devoid of scratches. In addition to or oin place of graining, it will be understood that the support may be first treated with some material, such as described in U.S. Pat. Nos. 3,440,959 or 3,470,013, or Defensive Publication T-868,002, to vary the affinity of the surface to water or ink. The photocross-linkable polymer can be coated on the support by several methods, such as by compression molding or solvent casting. By the latter method the photocrosslinkable polymer will be dissolved in a suitable solvent such as water, alcohol, a halogenated hydrocarbon, ketone, aromatic, etc., and by trailing blade coating, spraying, curtain coating, dipping, etc., applied to the support and the solvent allowed to evaporate. Coatings of various thicknesses can be employed, depending upon the ultimate utility. For example, if the coated support is to be used in preparing relief printing plates, the thickness of the light-sensitive coating will be from about 5 mils to about 50 mils. On the other hand, if the coated support is to be used in preparing lithographic printing plates, then a thinner lightsensitive coating of from about 2 microns to about 50 microns will be used. If the coated support is to be used as an etching resist for printed circuits, the thickness of the light-sensitive coating will be from about 0.5 micron to about 5 microns.

The photocross-linkable polymers having pendant diazo ester groups of this invention can be cross-linked by exposure to actinic radiation of from about 2000 A. to about 5000 A. Most preferably, the light will be from about 3000 A. to about 5000 A. Any of the commercial light sources emitting in this region, such as mercury vapor lights, carbon arc, tungsten filament, etc., can be used to expose and cross-link the polymers. Various time periods are required for the exposure, depending upon the specific diazo ester containing polymer and the intensity of the light. In general, exposure of from about 30 seconds to about 30 minutes will be sufficient to effect cross-linking. After exposure of a photocross-linkable polymer coated support, as for example, through a negative, the exposed portions will be cross-linked and insoluble in the usual solvent for the polymer, while the unexposed portions will be uncross-linked and removable by washing (i.e., developing) in a solvent for the polymer. The same solvents disclosed above as useful in solvent casting the polymers on a substrate can be used to wash away unexposed (i.e., uncrosslinked) polymer. In the case of etching resists for printed circuits, a typical procedure is to expose the photocross-linkable polymer coating through a negative or some other masking means, wash away uncross-linked polymer to expose the metal laminate surface and then etch away the exposed metal.

The following examples are presented for purposes of illustration, parts and percentages being by weight unless otherwise specified.

EXAMPLE 1

This example illustrates the preparation of a polymer containing pendant diazoacetyl groups.

A p-toluenesulfonyl hydrazone of glyoxylic acid is prepared from 22.7 parts of glyoxylic acid and 46.6 parts of p-toluenesulfonylhydrazide. After recrystallizing from ethyl acetate-carbon tetrachloride, 20 parts of the hydrazone glyoxylic acid and 24 parts thionyl chloirde are refluxed in approximately 100 parts of benzene for two hours, after which the volatiles are removed at aspirator pressure. The residue is triturated with a small amount of warm benzene, collected and recrystallized from a mixture of benzene and petroleum ether to yield the p-toluenesulfonyl hydrazone of glyoxylic acid chloride, which can be shown as follows:

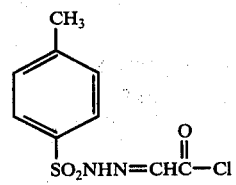

A solution is prepared containing 7 parts of the p-toluenesulfonyl hydrazone of glyoxylic acid chloride and 5.7 parts of a phenoxy resin, having the general formula

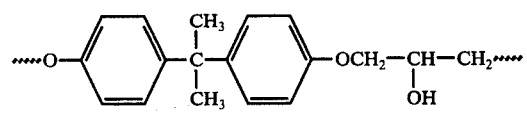

in approximately 100 parts of methylene chloride. To the solution is added dropwise with stirring in the dark 6.1 parts of triethylamine. The reaction mixture is allowed to stand in the dark for three hours and then precipitated by adding to methanol. The resulting product contains monomer units with the general formula

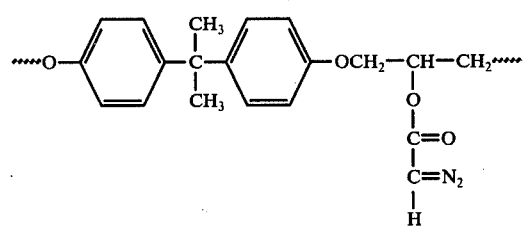

The modified resin exhibits strong infrared absorption at 4.75 $\mu$ and 5.9 $\mu$, showing the presence of $>C=N_2$ and $>C=O$ groups, and indicating that about 26% of the hydroxyl groups are substituted.

A relief printing plate is prepared by coating a grained sheet of polyethylene terephthalate with a solution of the diazoacetyl modified resin in methylene chloride and evaporating the solvent with a stream of nitrogen. The resulting 20 mil coated film is covered with a photographic transparency and exposed for 30 minutes to a 450 watt mercury lamp at a distance of approximately 2 inches. The exposed coating is then washed with methylene chloride to give a sharp high resolution relief image. Similarly, a 0.5 mil film of the diazoacetyl modified resin on a grained aluminum lithographic plate is prepaed, exposed and developed as described above to give a high resolution image which accepts ink relative to the aluminum substrate.

EXAMPLE 2

This example illustrates the preparation of a polymer containing pendant ethyldiazomalonyl groups.

To a solution of 3.4 parts of the hydroxypropyl cellulose shown in U.S. Pat. No. 3,278,521 and having a molar substitution (M.S.) of 3.5 dissolved in equal parts of tetrahydrofuran and methylene chloride is added 1.6 parts of pyridine and 3.0 parts of ethylmalonyl chloride with stirring. The reaction mixture is allowed to stand for two days and then the solids (pyridine hydrochloride) removed by filtration. The solvent is stripped from the filtrate at reduced pressure, the product is redissolved in tetrahydrofuran and reprecipitated by pouring into water at 60° C. Approximately 75% of the hydroxyl groups of the hydroxypropyl cellulose are esterified.

To a solution of 2.8 parts of the abofe ethylmalonyl derivative of the hydroxypropyl cellulose in methylene chloride is added 1 part triethylamine and 2 parts of p-toluenesulfonyl azide. The solution is allowed to stand in the dark for two days and the solvent removed under vacuum. The residue is dissolved in tetrahydrofuran and reprecipitated by pouring into water at 60° C. The resulting product exhibits a strong infrared absorption at 4.7 μ showing the presence of

groups.

A relief printing plate is prepared by coating a grained sheet of polyethylene terephthalate with a solution of the ethyldiazomalonyl modified cellulose in methylene chloride and evaporating the solvent with a stream of nitrogen. The resulting 5 mil coated film is covered with a photographic transparency and exposed for 20 minutes to a 450 watt medium pressure mercury lamp at a distance of approximately 2 inches. The exposed coating is then washed with methylene chloride to give a sharp relief image.

EXAMPLE 3

This example illustrates the preparation of another polymer containing pendant ethyldiazomalonyl groups.

An ethylene—vinyl acetate copolymer, containing approximately 28 weight percent of groups derived from vinyl acetate, is saponified to yield a copolymer having the general formula

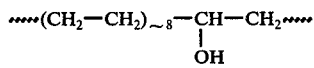

To a mixture of 2.6 parts of the saponified copolymer and 88 parts of benzene is added 1.5 parts of ethylmalonyl chloride and the mixture heated at reflux for 1.5 hours during which time all the solids go into solution. To the resulting solution is added 1.1 parts of 2,6-lutidine and the mixture heated at reflux. After 2 hours the refluxing mixture is filtered hot and the filtrate poured with stirring into 316 parts of methanol. The precipitate is collected and washed with methanol. The resulting ethyl malonate modified copolymer exhibits a strong infrared absorption at 5.75 μ and has monomer units with the general formula

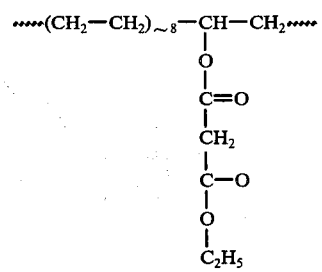

To a solution of 1.8 parts of the ethyl malonate modified copolymer in methylene chloride is added 0.5 part of triethylamine and 1.0 part of p-toluenesulfonylazide. The mixture is allowed to stand at room temperature in the dark for two days and then the product is precipitated by pouring it into about 150 parts of methanol. The precipitated product is collected and washed with methanol. The resulting ethyl diazomalonate modified copolymer exhibits strong infrared absorption at 4.7 μ and 5.75 μ and has structural units with the general formula

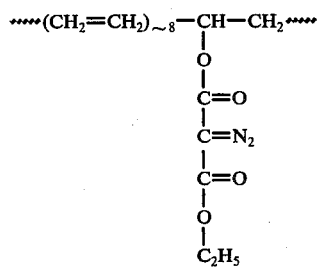

A relief printing plate is prepared by coating a grained sheet of polyethylene terephthalate with a 10% solution of the ethyl diazomalonate modified copolymer in toluene and drying in a stream of nitrogen. The resulting 10 mil coated film is covered with a photographic negative and exposed 15 minutes to a 450 watt mercury lamp at a distance of 2 inches. The exposed film is then washed with methylene chloride to give a high resolution image in which the half-tone dots are clearly visible.

EXAMPLE 4

This example illustrates the preparation of a polymer containing pendant acetodiazoacetyl groups.

To a suspension of 2.6 parts of the saponified copolymer described in Example 3 in 44 parts of benzene is added 2.5 parts of diketene dissolved in an equal amount of acetone. The mixture is heated on a steam bath for 5 minutes and poured with stirring into approximately 400 parts of methanol. The precipitate is collected and washed with methanol. The resulting acetoacetate modified copolymer is diazotized using triethylamine and p-toluenesulfonylazide by the method described in Example 3. The resulting diazoacetoacetate modified copolymer exhibits strong infrared absorption at 4.7 μ and 5.8 μ and has structural units with the general formula

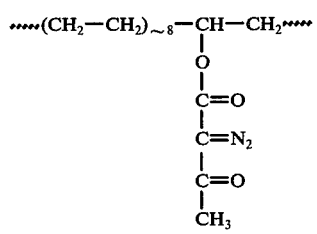

A 6% solution of the diazoacetoacetate modified polymer in methylene chloride is coated on a grained sheet of polyethylene terephthalate, and the solvent evaporated to give a coated thickness of 8 mils. The film is covered with a photographic transparency and exposed to a 450 watt mercury lamp for 30 minutes. The exposed coating is washed with methylene chloride to give a well defined relief image.

EXAMPLE 5

This example illustrates the preparation of a polymer containing pendant p-nitrophenyldiazoacetate groups.

To a suspension of 2.6 parts of the saponified copolymer described in Example 3 in 44 parts of benzene is added 2 parts of p-nitrophenylacetyl chloride. The mixture is heated at reflux for 3 hours and 0.8 part of pyridine added. After standing at room temperature for an hour, the reaction mixture is poured into 240 parts of methanol. The precipitate is collected and washed with methanol.

To a solution of 2 parts of the p-nitrophenylacetate modified olymer in 98 parts of dry pyridine, cooled in an ice bath, is added 0.4 part of piperidine and 1.0 part of p-toluenesulfonylazide with stirring. The solution is stored in the dark overnight and then poured into 316 parts of methanol. The bright yellow precipitate is collected and washed with methanol. The resulting p-nitrophenyldiazoacetate modified copolymer exhibits strong infrared absorption at 4.8 $\mu$, 6.6 $\mu$ and 7.5 $\mu$ and has structural units with the general formula

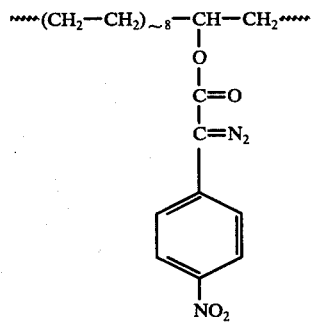

A relief printing plate is prepared by coating a grained sheet of polyethylene terephthalate with a solution of the p-nitrophenyldiazoacetate modified copolymer in methylene chloride and evaporating the solvent with a stream of nitrogen. The resulting 5 mil coated film is covered with a photographic negative and exposed to a 450 watt mercury lamp at a distance of 2 inches. The exposed coating is then washed with toluene to give a good raised image. Exceptionally high resolution of the half-tone dots is noted.

EXAMPLE 6

To a suspension of 3.0 parts of the saponified copolymer described in Example 3 and 50 parts of benzene is added 2.4 parts of phenylmalonyl chloride and 1.0 part of pyridine. The mixture is heated at reflux for 1.5 hours and allowed to cool to room temperature. The reaction mixture is poured into 300 parts of methanol and the precipitated polymer collected and washed with methanol. To a solution of 2.1 parts of the phenyl malonate modified copolymer in methylene chloride is added 0.5 part triethylamine and 1.0 part of p-toluenesulfonylazide. The mixture is allowed to stand at room temperature in the dark for 2 days, and the polymer precipitated by pouring into 200 parts of methanol. After washing with methanol, the polymer exhibits strong infrared absorption at 4.7 $\mu$.

A lithographic plate is prepared by whirl coating a 5% solution of the phenyldiazomalonate modified copolymer in chloroform onto a brush grained aluminum plate. After drying at room temperature, the plate is covered with a photographic negative containing line work and half-tone pictures, and exposed to a bank of four mercury arcs rated as 80 watts/linear inch. The exposed film is washed with chloroform to give a good image. The plate was rubbed with gum arabic solutions and gave excellent prints when used on an offset lithographic press.

EXAMPLE 7

To a solution of 11.0 parts of poly (vinyl alcohol), having a molecular weight of approximately 96,000, in 200 parts of N-methyl pyrrolidone is added 18.9 parts of ethylmalonyl chloride and 5.0 parts of acetyl chloride with stirring. The reaction mixture is poured into 4000 parts of water to precipitate the polymer. The solids are collected and washed with water.

To a solution of 17.8 parts of the ethyl malonate modified polymer in 310 parts of acetonitrile is added successively 8.1 parts of triethylamine and 15.7 parts of p-toluenesulfonylazide. The solution is stored in the dark for two days, and poured into 2500 parts of water. The solids are collected, taken up in 270 parts of acetonitrile and reprecipitated. The infrared spectrum has a band at 4.7 $\mu$ indicating the presence of diazo ester groups.

A 5% (wt./vol.) solution of the above ethyl diazomalonate polymer in chloroform is whirl coated on a 6-mil grained aluminum plate, dried at room temperature, and exposed for two minutes through a photographic negative and a Stauffer 21 Step Sensitivity Guide (AT 20 × 0.15) to a bank of four medium pressure mercury arcs rated at 80 watts/linear inch. The plate is washed with acetone to yield a sharp image and a solid coating at step 5 on the guide. The plate is rubbed successively with gum arabic solution, commercial fountain solution (3 oz./gal.), and commercial lithographic rub up ink. The image areas accept the ink while the substrate aluminum does not.

EXAMPLE 8

To a solution of 8.8 parts of the poly (vinyl alcohol), 96,000 mol wt., described in Example 7, in 150 parts of N-methyl pyrrolidone is added 7.8 parts of acetyl chloride and 20.0 parts of p-nitrophenylacetyl chloride with stirring. The solution is allowed to stand for 24 hours, and is poured into 4000 parts of water. The precipitate is collected and washed with water.

To a solution of 2.9 parts of the p-nitrophenyl acetate modified polymer in 145 parts of dry pyridine is added 0.9 part of piperidine and 2.0 parts of p-toluenesulfonyl azide. The solution is kept in the dark overnight and poured with stirring into 465 parts of methanol. The yellow precipitate is collected, chopped, and washed with methanol. The infrared spectrum of the dried polymer shows strong absorption at 4.8 $\mu$.

A solution of the p-nitrophenyldiazoacetate modified polymer in chloroform is whirl coated on a 6 mil grained aluminum plate and dried at room temperature in the dark to give a film approximately 5 $\mu$ thick. The film is exposed through a photographic negative to the light from a 650 watt quartz-halogen tungsten lamp at a distance of 12 inches. The plate is washed gently with chloroform. An orange image remains in the areas exposed to the light, while the background dissolves, exposing the aluminum substrate. The plate is rubbed with 14° Baume gum arabic solution and then with commercial lithographic rub up ink. The image areas accept the ink while the substrate aluminum does not.

What I claim and desire to protect by Letters Patent is:

1. A polymer photocross-linkable to actinic radiation containing the following units

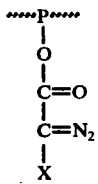

where P is derived from a soluble hydroxy containing polymer which has been esterified to give the above pendant groups and X is a radical selected from the group consisting of —H,

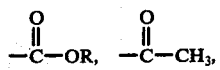

—CN and —Ar, where Ar is selected from phenyl and phenyl substituted with 1 to 3 —$NO_2$, Cl, F, Br, $C_{1-8}$ alkyl or $C_{1-5}$ alkyloxy groups and R is selected from $C_{1-18}$ alkyl, $C_{5-7}$ cycloalkyl, $C_{1-4}$ alkyl substituted $C_{5-7}$ cycloalkyl and Ar, where Ar is as defined above.

2. The photosensitive polymer of claim 1 wherein the pendant diazo ester groups are diazoacetate groups.

3. The photosensitive polymer of claim 1 wherein the pendant diazo ester groups are diazomalonate groups.

4. The photosensitive polymer of claim 1 wherein the pendant diazo ester groups are acetodiazoacetate groups.

5. The photosensitive polymer of claim 1 wherein the pendant diazo ester groups are p-nitrophenyldiazoacetate groups.

* * * * *

UNITED STATES PATENT AND TRADEMARK OFFICE
CERTIFICATE OF CORRECTION

PATENT NO. : U.S.P. 4,038,253

DATED : July 26, 1977

INVENTOR(S) : Brian D. Kramer

It is certified that error appears in the above-identified patent and that said Letters Patent are hereby corrected as shown below:

Col. 4, Line 10
  "octyldizomalonyl"  -- should be --  "octyldiazomalonyl"

Col. 4, Line 16
  "alcoho)"  -- should be --  "alcohol)"

Col. 4, Line 22
  "dinitrophenyldizomalonyl"  -- should be --
          "dinitrophenyldiazomalonyl"

Col. 4, Line 68
  "oin"  -- should be --  "in"

Col. 6, Line 54
  "prepaed"  -- should be --  "prepared"

Col. 7, Line 6
  "abofe"  -- should be --  "above"

UNITED STATES PATENT AND TRADEMARK OFFICE
CERTIFICATE OF CORRECTION

PATENT NO. : U.S.P. 4,038,253
DATED : July 26, 1977
INVENTOR(S) : Brian D. Kramer It is certified that error appears in the above-identified patent and that said Letters Patent are hereby corrected as shown below:

Col. 7, Line 55-65

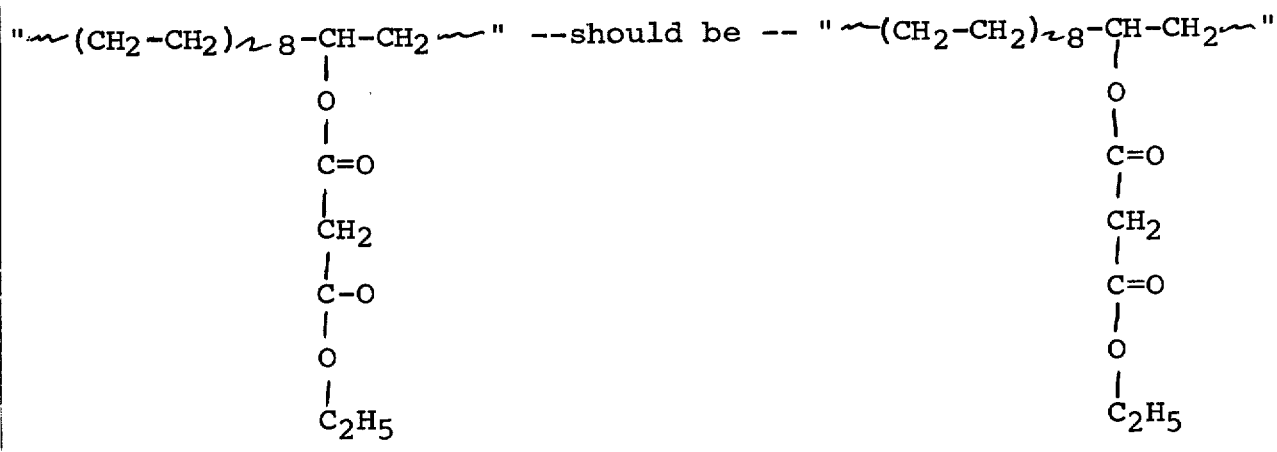

Col. 8, Line 12

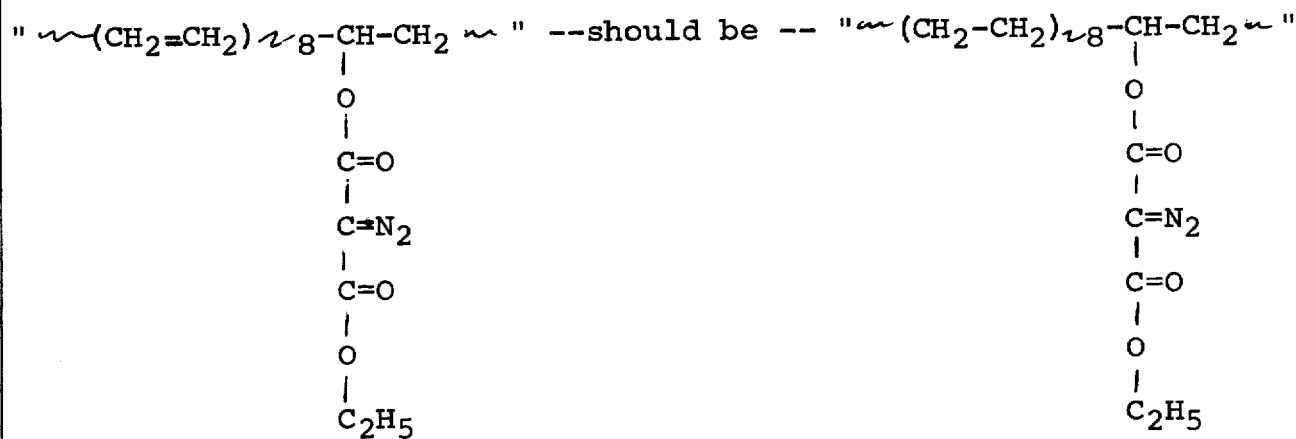

UNITED STATES PATENT AND TRADEMARK OFFICE
CERTIFICATE OF CORRECTION

PATENT NO. : U.S.P. 4,038,253
DATED : July 26, 1977
INVENTOR(S) : Brian D. Kramer It is certified that error appears in the above-identified patent and that said Letters Patent are hereby corrected as shown below:

Col. 9, Line 12
  "olymer" -- should be -- "polymer"

Signed and Sealed this

Twenty-ninth Day of November 1977

[SEAL]

Attest:

RUTH C. MASON
Attesting Officer

LUTRELLE F. PARKER
Acting Commissioner of Patents and Trademarks